(12) United States Patent
Fujimori et al.

(10) Patent No.: US 7,026,033 B2
(45) Date of Patent: Apr. 11, 2006

(54) HEAT-RESISTANT SYNTHETIC FIBER SHEET

(75) Inventors: Tatsushi Fujimori, Ibaraki (JP); Sadamitsu Murayama, Ibaraki (JP)

(73) Assignee: Teijin Techno Products Limited, Osaka (JP)

( * ) Notice: Subject to any disclaimer, the term of this patent is extended or adjusted under 35 U.S.C. 154(b) by 0 days.

(21) Appl. No.: 10/485,709

(22) PCT Filed: Apr. 25, 2003

(86) PCT No.: PCT/JP03/05390

§ 371 (c)(1),
(2), (4) Date: Feb. 4, 2004

(87) PCT Pub. No.: WO03/093576

PCT Pub. Date: Nov. 13, 2003

(65) Prior Publication Data

US 2004/0180185 A1   Sep. 16, 2004

(30) Foreign Application Priority Data

May 2, 2002   (JP)   ............................. 2002-130390

(51) Int. Cl.
*B32B 5/12*   (2006.01)

(52) U.S. Cl. ...................... 428/112; 428/220; 428/323; 428/113; 428/121; 428/130; 428/332; 428/327; 162/146; 162/157.3; 162/164.1; 442/60; 442/414

(58) Field of Classification Search ............. 428/474.4, 428/458, 476.3, 607, 625, 423.5, 626, 425.1
See application file for complete search history.

(56) References Cited

U.S. PATENT DOCUMENTS 4,698,267 A * 10/1987 Tokarsky ................. 428/474.4
5,783,039 A *  7/1998 Murayama ................. 162/146
6,407,017 B1 *  6/2002 Wada et al. ............... 442/335

FOREIGN PATENT DOCUMENTS

| EP | 790341 A2 | 8/1997 |
|---|---|---|
| EP | 994215 A1 | 4/2000 |
| JP | 01-092233 A | 4/1989 |
| JP | 02-010684 A | 1/1990 |
| JP | 02-047392 A | 2/1990 |
| JP | 02-236907 A | 9/1990 |
| JP | 2001-295191 A | 10/2001 |
| WO | 02/12619 A1 | 2/2002 |

* cited by examiner

*Primary Examiner*—Merrick Dixon
(74) *Attorney, Agent, or Firm*—Sughrue Mion, PLLC

(57) ABSTRACT

A heat-resistant fiber paper-like sheet comprises 40 to 97% by mass of heat-resistant organic synthetic polymers staple fibers, 3 to 60% by mass of heat resistant organic synthetic polymer fibrid and or an organic resin binder, in a portion of the staple fibers, each staple fiber having two flat end faces having an inclining angle of 10 degrees or more from a plane crossing the fiber axis at a right angles, and is useful as a base material for laminate materials for electrical circuit boards.

22 Claims, 1 Drawing Sheet

HEAT-RESISTANT SYNTHETIC FIBER SHEET

TECHNICAL FIELD

The present invention relates to a heat-resistant synthetic fiber sheet. More specifically, the invention relates to a heat-resistant synthetic fiber sheet that features excellent heat resistance and electrical insulation, and that can be preferably used as a laminated material for electrical circuitry.

BACKGROUND ART

A base material used for the laminated materials for electrical circuit boards must have excellent properties such as heat resistance, heat-resistant dimensional stability, humidity-resistant dimensional stability, electrical insulation and resistance against deformation (hardly twisting, warping or undulating). In the electrical circuit boards for small electronic devices such as cell phones, notebook personal computers and the like, further, the wiring must be formed very densely. Therefore, the base material therefor must meet various properties, such as low weight, in addition to the above-mentioned properties. The heat-resistant synthetic fiber sheet features excellent heat resistance, heat-resistant dimensional stability and light weight, as compared to sheet members made of other materials and has, in recent years, been used as a base material for the laminated material for electrical circuit boards that require the various properties described above.

For example, there have been known an electrically insulating aromatic polyamide fiber sheet comprising polymetaphenylene isophthalamide staple fibers (trademark: Conex, manufactured by Teijin Co.) and a polymetaphenylene isophthalamide pulp (fibrids) (Japanese Unexamined Patent Publications (Kokai) Nos. 2-236907 and 2-10684); a resin-impregnated aromatic polyamide fiber sheet comprising polyparaphenylene terephthalamide staple fibers (trademark: Kevlar, manufactured by du Pont Co.) or a copolyparaphenylene-3,4'-oxydiphenylene terephthalamide staple fibers (trademark: Technora, manufactured by Teijin Co.) and an organic resin binder (Japanese Unexamined Patent Publication (Kokai) No. 1-92233); and a method of producing the above aromatic polyamide fiber sheets (Japanese Unexamined Patent Publication (Kokai) No. 2-47392).

The former electrically insulating aromatic polyamide fiber sheet has excellent heat resistance. When heat-treated at a temperature of not lower than 250° C., however, this electrical insulating aromatic polyamide fiber sheet shrinks and changes in size. Besides, the fiber has a high equilibrium moisture content (water content) as well as a high impurity ion content. When placed for extended periods of time under highly humid condition, therefore, the electrical insulation becomes insufficient. Therefore, this aromatic polyamide fiber sheet cannot be used as a base material for electrical insulation where a high degree of reliability is required.

On the other hand, the latter resin-impregnated aromatic polyamide fiber sheet has a small equilibrium moisture content and a relatively small impurity ion content, but uses the organic resin only as a binder component. During the step of producing the aromatic polyamide fiber sheet, therefore, the binder component migrates to the front and back surface sides of the sheet and stays on the front and back surface sides. As a result, the amount of the binder component becomes small in the middle layer of the sheet; i.e., the resin distribution in the resin-impregnated aromatic polyamide fiber sheet loses uniformity in the direction of thickness, and performance becomes less reliable.

When the above-mentioned conventional heat-resistant synthetic fiber sheet is used as a base material for electrical insulating materials, therefore, dispersion increases in the amount of the blended varnish that is impregnated (particularly, in the direction of thickness) or that is adhered in the step of production, particularly, during the step of preparing a prepreg by impregnating and drying a blended varnish, such as an epoxy resin, and in the step of laminating the obtained prepreg articles. Besides, the binder resin partly melts, whereby the adhering force among the fibers decreases and the sheet base material is caused to be broken. Further, the staple fibers move easily relative to each other, and the distribution of fiber densities loses uniformity causing the laminated material for electrical circuit boards to be deformed, particularly after the step of solder reflow that is carried out at a high temperature.

In order to solve the above problems inherent in the prior art, Japanese Unexamined Patent Publication (Kokai) No. 2001-295191 discloses a base material for the laminated material for electrical circuit boards, free of the above problems, obtained by using a fiber sheet that contains, as constituent elements, para-aromatic polyamide staple fibers, having two or more annular projections formed independently from each other in the longitudinal direction, and organic high molecular polymer fibrids.

In the para-aromatic polyamide staple fibers for the base material, however, two or more annular projections are, in many cases, formed on both flat end faces or on the portions close to both flat end faces of the staple fibers. Such projections promote the entanglement among the staple fibers and, hence, the fibers are not fully opened in the step of paper-making. In order to obtain a synthetic fiber sheet in which the staple fibers are uniformly distributed in the direction of plane and in the direction of thickness, therefore, a step must be provided to disaggregate the staple fibers to a sufficient degree causing, however, a drop in the productivity.

Further, if the synthetic fiber sheet is prepared in a state where the fibers are not fully opened, non-uniform portions are contained in the laminated material for electrical circuitry that is obtained. In particular, after the step of solder reflow executed at a high temperature, the laminated material for electrical circuit boards undergoes the problem of deformation. It has, therefore, been desired to solve this problem.

DISCLOSURE OF THE INVENTION

It is, therefore, an object of the present invention to provide a heat-resistant synthetic fiber sheet that exhibits excellent heat resistance, heat-resistant dimensional stability and electrical insulation under highly humid conditions, that is suited for use as a base material for the laminated material for electrical circuitry, that is free from, or decreases, the above-mentioned problems possessed by the conventional heat-resistant synthetic fiber sheets and, particularly, free from, or decreases, deformation (twisting, warping, undulation, etc.) in the step of producing a laminated material for electrical circuit boards, that is free from the problem of lack of electrical insulation under highly humid conditions, and that can be produced by a known method without decreasing the productivity.

A heat-resistant synthetic fiber sheet of the present invention comprises, as principal components, a plurality of staple fibers comprising a heat-resistant organic synthetic polymeric material, and heat resistant organic polymer fibrids and/or organic resin binders, wherein, the plurality of staple fibers are bound to each other through the organic synthetic fibrids and/or organic resin binders, to form a paper-like sheet, the content of the staple fibers is in the range of 40 to 97% by mass on the basis of the total mass of the sheet, and the total content of the organic synthetic polymer fibrids and/or organic resin binders is in the range of from 3 to 60% by mass on the basis of the total mass of the sheet, and at least a portion of the staple fibers each have two flat end faces at an angle of 10 degrees or more to a plane crossing the fiber axis of the staple fiber at right angles.

In the heat-resistant synthetic fiber sheet of the present invention, it is desired that at least a portion of the plurality of the heat-resistant organic synthetic polymer staple fibers each have at least two annular projections spaced apart from each other in the longitudinal direction of the staple fiber, and in each staple fiber, the largest cross-sectional size of the annular projection is 1.1 times or more the average cross-sectional size of a portion between the two annular projections of the staple fiber.

In the heat-resistant synthetic fiber sheet of the present invention, it is desired that, in each of the plurality of heat-resistant organic synthetic polymer staple fibers, the two flat end faces at an angle of 10 degrees or more to the fiber axis are formed in the annular projections.

In the heat-resistant synthetic fiber sheet of the present invention, it is desired that the plurality of heat-resistant organic synthetic polymer staple fibers contain para-aromatic polyamide staple fibers in an amount of 40% by mass or more, on the basis of the total mass of the plurality of heat-resistant synthetic polymer staple fibers.

In the heat-resistant synthetic fiber sheet of the present invention, it is desired that the para-aromatic polyamide staple fibers are selected from staple fibers comprising a polyparaphenylene terephthalamide and staple fibers comprising a copolyparaphenylene-3,4'-oxydiphenylene terephthalamide.

In the heat-resistant synthetic fiber sheet of the present invention, it is desired that the heat-resistant organic synthetic polymer, from which the staple fibers are formed, is selected from wholly aromatic polyesters exhibiting a liquid crystalline property upon melting.

In the heat-resistant synthetic fiber sheet of the present invention, it is desired that the heat-resistant organic synthetic polymer, from which the staple fibers are formed, is selected from heterocyclic group-containing aromatic polymers.

In the heat-resistant synthetic fiber sheet of the present invention, it is desired that the heat-resistant organic synthetic polymer, from which the staple fibers are formed, is selected from polyetheretherketones.

In the heat-resistant synthetic fiber sheet of the present invention, it is desired that the plurality of heat-resistant organic synthetic polymer staple fibers have a fiber length in the range of from 2 to 12 mm.

In the heat-resistant synthetic fiber sheet of the present invention, it is desired that at least a portion of the fibrids comprising the organic synthetic polymer melt-bonds the plurality of staple fibers to each other therethrough.

In the heat-resistant synthetic fiber sheet of the present invention, it is desired that the heat-resistant organic synthetic polymer from which the fibrids are formed, has a thermal decomposition-initiating temperature of 330° C. or more.

In the heat-resistant synthetic fiber sheet of the present invention, it is desired that the heat-resistant organic synthetic polymer fibrids have an equilibrium moisture content of 7.5% or less.

In the heat-resistant synthetic fiber sheet of the present invention, it is desired that the heat-resistant organic synthetic polymer fibrids are the ones prepared by mixing a solution of the organic synthetic polymer for the fibrids with a precipitating medium for the synthetic polymer solution, while applying a shearing force to the solution.

In the heat-resistant synthetic fiber sheet of the present invention, it is desired that the heat-resistant organic synthetic polymer fibrids are the ones prepared in a procedure such that shaped articles having a molecule-orienting property are formed from a solution of the organic synthetic polymer having an optical anisotropy, and applying a mechanical shearing force to the molecule-oriented shaped articles to fibrillate at random the molecule-oriented shaped articles.

In the heat-resistant synthetic fiber sheet of the present invention, it is desired that the heat-resistant organic synthetic polymer, from which the fibrids are formed, is selected from polyparaphenylene terephthalamide and copolyparaphenylene-3,4'-oxydiphenylene terephthalamide.

In the heat-resistant synthetic fiber sheet of the present invention, the heat-resistant organic synthetic polymer, from which the fibrids are formed, may be selected from wholly aromatic polyesters exhibiting a liquid crystalline property upon melting.

In the heat-resistant synthetic fiber sheet of the present invention, the heat-resistant synthetic polymer from which the fibrids are formed, may be selected from the heterocyclic ring-containing aromatic polymers.

In the heat-resistant synthetic fiber sheet of the present invention, it is desired that the organic resin binder comprises at least one member selected from the group consisting of epoxy resins, phenol resins, melamine reins, formaldehyde resins and fluoro polymer resins.

It is desired that the heat-resistant synthetic fiber sheet of the present invention has a bulk density of 0.40 to 1.13 g/cm³.

It is desired that the heat-resistant synthetic fiber sheet of the present invention exhibits a dimensional change of 0.30 or less in the longitudinal direction of the sheet when the sheet is heat-treated at a temperature of 280° C. for 5 minutes.

A prepreg of the present invention comprises a heat-resistant synthetic fiber sheet of the invention and a thermosetting resin with which the synthetic fiber sheet is impregnated.

A laminated board including a heat press-shaped article of a prepreg of the invention comprises a heat-resistant synthetic fiber sheet of the invention and a thermosetting resin with which the synthetic fiber sheet is impregnated.

BEST MODE FOR CARRYING OUT THE INVENTION

Figure 1:
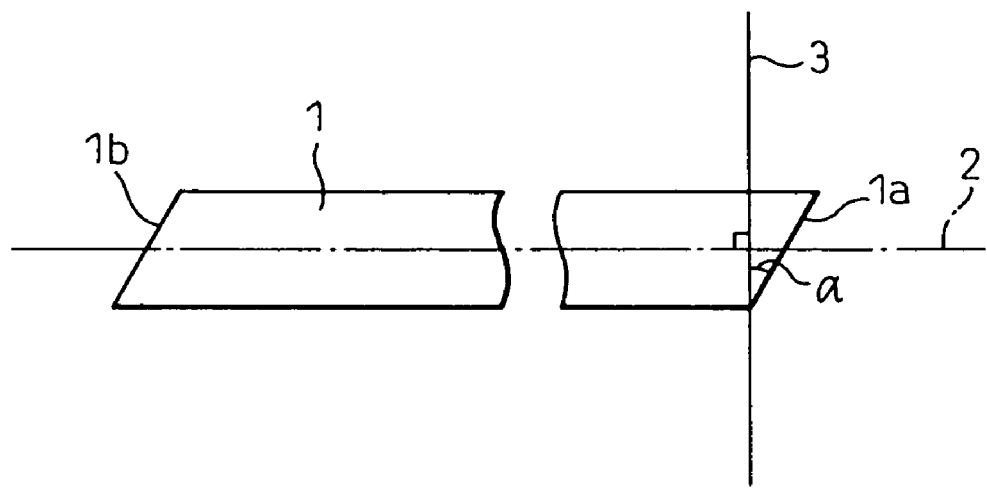
FIG. 1 is a side view illustrating the shape of a staple fiber comprising a heat-resistant organic synthetic polymer contained in a heat-resistant synthetic fiber sheet of the present invention.

The present inventors have conducted studies in an attempt to achieve the above-mentioned object and have discovered the fact that the staple fibers constituting the heat-resistant synthetic fiber sheet can be opened to a sufficient degree when the staple fibers comprising a heat-resistant organic synthetic polymer such as para-aromatic polyamide staple fibers have faces that are cut at an angle of 10 degrees or more to a plane crossing the fiber axis at right angles, that properties of the sheet and uniformity between the sheet layers after the heat press-shaping can be improved, that various properties possessed by the laminated material for electrical circuit boards, such as impregnation of varnish to be blended and electrical insulation, can be further improved, and have thus completed the invention.

In the present invention, the heat-resistant synthetic fiber sheet includes a sheet comprising, as principal components, a plurality of staple fibers of a heat-resistant organic synthetic polymer, and heat-resistant organic synthetic polymer fibrids and/or organic resin binders, and, particularly, a paper-like sheet, a nonwoven sheet and any other sheet-like material. Here, the ratio of the heat-resistant organic synthetic polymer staple fibers to the whole mass of the synthetic fiber sheet, is from 40 to 97% by mass, preferably, from 55 to 96% by mass and, more preferably, from 70 to 95% by mass.

As the heat-resistant organic synthetic polymer staple fibers, there can be used aromatic polyamide staple fibers having a fiber-forming property and a thermal decomposition-initiating temperature of 330° C. or more, wholly aromatic polyester staple fibers exhibiting a liquid crystalline property upon melting, heterocyclic rint-containing aromatic polymer staple fibers, and polyetheretherketone staple fibers. Among them, it is desired to use the aromatic polyamide staple fibers. The staple fibers may be used in a single kind or being mixed together in two or more kinds.

The aromatic polyamide used for the heat-resistant organic synthetic polymer staple fibers contains an aromatic homopolyamide and an aromatic copolyamide of which not less than 80 mol % (preferably, not less than 90 mol %) of the recurring units constituting the polyamide are the recurring units represented by the following formula (1), $$-NH-Ar_1-NHCO-Ar_2-CO- \quad (1)$$

wherein $Ar_1$ and $Ar_2$ are, independently from each other, divalent aromatic groups.

It is desired that the divalent aromatic groups represented by $Ar_1$ and $Ar_2$ are selected from the groups of the following formulas (2),

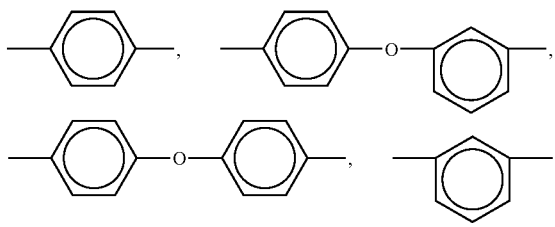

(2)

In the divalent aromatic groups of the above formulas (2), one or more hydrogen atoms may be substituted by one or more of halogen atoms, lower alkyl groups, or phenyl groups.

The methods of producing the aromatic polyamide fibers used for the heat-resistant synthetic fiber sheet of the invention and the fiber properties have been disclosed in, for example, British Patent No. 1501948, U.S. Pat. No. 3733964, U.S. Pat. No. 3767756 and U.S. Pat. No. 3869429, and Japanese Unexamined Patent Publications (Kokai) No. 49-100322, No. 47-10863, No. 58-144152 and No. 4-65513.

As the aromatic polyamide fiber having excellent heat resistance, in particular, there can be exemplified a para-aromatic polyamide fiber which is an aromatic polyamide fiber represented by the above formula (1) in which $Ar_1$ and $Ar_2$ are aromatic groups at para-positions and of which the total molar amount is not smaller than 50 mol %. Concrete examples thereof include polyparaphenylene terephthalamide staple fibers (trademark: Kevlar, manufactured by du Pont Co.) and copolyparaphenylene-3,4'-oxydiphenylene terephthalamide staple fibers (trademark: Technora, manufactured by Teijin Co.).

In particular, the latter example contains impurity ions in only small amounts and exhibits excellent electrical insulation, and is, hence, is useful as an electrically insulating synthetic fiber sheet.

As the staple fibers for the synthetic fiber sheet of the present invention, further, there may be used meta-aromatic polyamide staple fibers together with the above para-aromatic polyamide staple fibers. The above meta-aromatic polyamide is the aromatic polyamide of the above formula (1) in which $Ar_1$ and $Ar_2$ are divalent aromatic groups of which the total molar amount is not smaller than 50 mol %, and having non-coaxial and non-parallel chain bonds which are not in parallel. Examples thereof include staple fibers of a homopolymer or a copolymerized polymer obtained by using one or two or more of terephthalic acid and isophthalic acid as dicarboxylic acid components, and one or two or more of metaphenylene diamine, 4,4-diaminophenyl ether, 4,4'-diaminodiphenylmethane and xylylene diamine as diamines. Representative examples include staple fibers of a copolymerized aromatic polyamide obtained by copolymerizing polymetaphenylene isophthalamide, polymetaxylylene terephthalamide or isophthalic acid chloride, terephthalic acid chloride or metaphenylenediamine. In particular, the aromatic polyamide staple fibers in which not less than 80 mol % and, preferably, not less than 90 mol % of the recurring units are metaphenylene isophthalamide groups, easily melt locally under high temperature and high pressure conditions to more favorably exhibit the binder effect, and are desired for use as staple fibers for synthetic fiber sheets of the present invention.

In the heat-resistant synthetic fiber sheet of the invention, further, it is desired that the para-aromatic polyamide staple fibers are used at a ratio of not smaller than 40% by mass and, preferably, not smaller than 50% by mass on the basis of the total mass of the organic synthetic polymer staple fibers. When the content of the para-aromatic polyamide staple fibers is smaller than 40% by mass, the sheet that is obtained may fail to fully exhibit the effect of the staple fibers that have flat end faces at an angle of 10 degrees or more to the plane crossing the axis of the fiber at right angles.

When the meta-aromatic polyamide staple fibers are used for the synthetic fiber sheet of the present invention, it is desired that the stretching ratio of the fibers is controlled to be smaller than 5.0 times and, more preferably, smaller than 2.8 times in the step of producing the meta-aromatic polyamide staple fibers, so that the role thereof as a binder material is exhibited to a maximum degree. Or, it is desired to use unstretched staple fibers. Among them, it is particularly desired to use the stretched meta-aromatic polyamide staple fibers that are stretched at a ratio in a range of from 1.1 to 1.5.

In the step of producing the meta-aromatic polyamide staple fibers, further, it is desired that thermal hysteresis is not imparted, as much as possible. The reason is because, the fibers are crystallized as the stretching ratio increases and as the fibers are subjected to the thermal hysteresis such as heat treatment in the step of production, and the staple fibers tend to be less softened and less melted and, thus, less exhibits a performance as a binder material.

Among the above aromatic polyamide fibers, some tend to shrink in the direction of fiber axis and some tend to stretch when they are put to the treatment for removing (dehydrating, dehumidifying) water component (moisture) contained in the fiber by heating. By suitably controlling the blending ratio of the thermally shrinking aromatic polyamide fibers and the thermally stretching aromatic polyamide fibers, therefore, there is obtained an aromatic polyamide fiber sheet having a small dimensional change and exhibiting excellent heat-resistant dimensional stability and humidity-resistant dimensional stability even after repeating the steps of washing with water and drying.

As the staple fibers of a heat-resistant organic synthetic polymer other than the aromatic polyamide staple fibers, there can be exemplified staple fibers of a wholly aromatic polyester exhibiting liquid crystalline property upon melting, staple fibers of a heterocyclic ring-containing aromatic polymer such as polyparaphenylene benzobisthiazole and polyparaphenylene benzobisoxazole, and staple fibers of a polyetheretherketone.

Next, at least a portion of the heat-resistant organic synthetic polymer staple fibers contained in the heat-resistant synthetic fiber sheet of the present invention, comprises staple fibers having flat end faces of a shape as shown in FIG. 1. In FIG. 1, two flat end faces 1a and 1b of the staple fiber 1 are inclined at an angle α of not smaller than 10 degrees, preferably, not smaller than 15 degrees and, more preferably, not smaller than 20 degrees with respect to a plane 3 that crosses the fiber axis 2 at right angles. The inclined flat end faces of the staple fibers can be formed by a variety of methods. For example, in producing staple fibers by cutting filament tows, a guillotine cutter is used to cut the filament tows with the lengthwise direction of the blade thereof being inclined by a desired angle, such as 10 to 30 degrees from a plane that crosses the lengthwise direction of the filament tows at right angles. Or, a rotary cutter is used to cut the filament tows at a desired angle from a plane that crosses the lengthwise direction thereof at right angles.

Annular projections can be formed at the cut end faces depending upon the cutting device and the cutting conditions.

To form the annular projections having inclined end faces at both ends of the staple fibers, there may be used a guillotine cutter having a blade made of a material of a Rockwell hardness index of not smaller than HrA 80 and, preferably, HrA 85 to 95, or there may be used a rotary cutter to cut the staple fibers at a velocity of 10 to 300 m/min while imparting a strength of 0.03 to 8.8 cN/dtex (0.03 to 10 gf/de) to the filament toes.

Namely, in the heat-resistant synthetic fiber sheet of the present invention, it is desired that at least some of the plurality of heat-resistant organic synthetic polymer staple fibers have at least two annular projections that are spaced apart from each other in the longitudinal direction. In this case, it is desired that the largest cross-sectional size of the annular projection is 1.1 times or more and, preferably, 1.12 to 2.0 times of the average cross-sectional size of a portion between the two annular projections of the staple fiber.

It is further desired that in each of the plurality of heat-resistant organic synthetic polymer staple fibers, the two flat end faces at an angle of 10 degrees or more to the fiber axis are formed in the annular projections.

Figure 2:
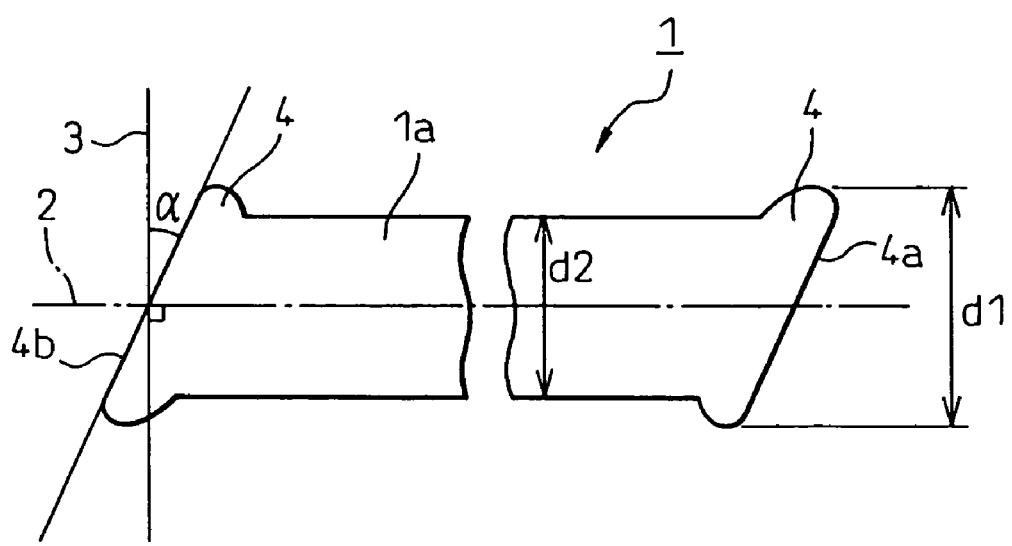
FIG. 2 is a side view illustrating the shape of a staple fiber (having annular projections at two flat end faces) comprising a heat-resistant organic synthetic polymer contained in a heat-resistant synthetic fiber sheet of the present invention.

FIG. 2 is a side view illustrating a heat-resistant organic synthetic polymer staple fiber having inclined flat end faces formed in the annular projections.

In FIG. 2, annular projections 4 are formed at two flat end faces of the staple fiber 1. Here, if the cross-sectional size of the annular projection projected onto the plane at right angles with the fiber axis 2 of the staple fiber 1 is denoted by d1 and the average cross-sectional size of an intermediate portion 1a between the two annular projections 4 of the staple fiber 1 is denoted by d2, then, it is desired that the ratio d1/d2 is 1.1 or more and, more preferably, from 1.12 to 2.0. Further, the outer flat end faces 4a of the annular projections 4 at both end faces of the staple fiber 1 are inclined at an angle α with respect to the plane 3 which meets the fiber axis 2 at right angles. The angle α of inclination is 10 degrees or more as described above and is, desirably, 15 to 60 degrees.

The annular projections having the inclined flat end faces work to reinforce the bonding of staple fibers in the synthetic fiber sheet, and to improve the mechanical strength of the synthetic fiber sheet, shape stability and dimensional stability.

The heat-resistant organic synthetic polymer staple fibers having such inclined flat end faces may be mixed with other staple fibers as part of the heat-resistant organic synthetic polymer staple fibers. In this case, it is desired that the staple fibers having inclined flat end faces occupy not less than 40% by weight and, more preferably, not less than 50% by mass of the total mass of the whole staple fibers. When the content of the staple fibers having the inclined flat end faces is smaller than 40% by mass, the opening of the staple fibers and the uniformity of distribution thereof in the synthetic fiber sheet are often not sufficient.

It is desired that the fineness of a single fiber in the heat-resistant synthetic polymer staple fibers is from 0.33 to 5.56 dtex (0.3 to 5.0 de) and, more preferably, from 0.33 to 2.22 dtex. When the fineness of the single fiber in the staple fibers is smaller than 0.33 dtex, a technical difficulty is involved in the production of fibers and, besides, yarns break and fluffs occur make it difficult to stably produce fibers of good quality and, further, drive up the cost of production. When the fineness exceeds 5.56 dtex, on the other hand, the mechanical properties of the fibers and, particularly, the mechanical strength become insufficient. The heat-resistant synthetic polymer staple fibers may be partly mechanically fibrillated but, desirably, at a ratio of not more than 50% by mass. When the content of the fibrillated staple fibers exceeds 50% by mass, the synthetic fiber sheet is not often impregnated with the blended varnish to a sufficient degree.

It is desired that the fiber length of the heat-resistant synthetic polymer staple fibers is in a range of from 1 to 60 mm and, more desirably, from 2 to 40 mm. When the synthetic fiber sheet is to be formed by the wet sheet-making method, in particular, it is desired that the fiber length of the heat-resistant synthetic staple fibers is in a range of from 2 to 12 mm. When the fiber length is smaller than 1 mm, the obtained synthetic fiber sheet (fiber aggregate) often exhibits insufficient mechanical properties. When the fiber length exceeds 60 mm, on the other hand, the staple fibers are insufficiently dispersed in the step of wet sheet making, and the fiber sheet exhibits insufficient uniformity and insufficient mechanical properties (strength, etc.).

Next, the fibrids of the heat-resistant organic synthetic polymer used for the synthetic fiber sheet of the invention are thin leaf-like or scale-like small pieces having a plurality of tiny fibrils with a binding performance for the staple fibers for forming sheet, or are very small fiber pieces that are fibrillated in a random fashion. The fibrids can be prepared by mixing a solution of the organic synthetic polymer with a precipitating medium for the synthetic polymerization, while applying a shearing force thereto as disclosed in, for example, Japanese Examined Patent Publications (Kokoku) Nos. 35-11851 and 37-5732, or by fibrillating, in a random fashion, the molecule-oriented shaped articles obtained from a solution of a high molecular polymer exhibiting an optical anisotropy by applying thereto mechanical shearing force such as of beating (the above fibrids are often called "synthetic pulp") as disclosed in Japanese Examined Patent Publication (Kokoku) No. 59-603. Of the above methods of producing fibrids, the former method is preferably used for producing the synthetic fiber sheet of the present invention.

The heat-resistant organic synthetic polymer used as a starting material for producing the fibrids is an organic synthetic polymer having fiber-forming property or film-forming property, and, desirably, has a thermal decomposition-initiating temperature of not lower than 330° C.

As the synthetic polymer for forming heat-resistant fibrids, there can be used, for example, aromatic polyamide, aromatic polyester and heterocyclic ring-containing aromatic polymer. Among them, it is particularly desired to use a polymetaphenylene isophthalamide (trademark: Nomex, manufactured by du Pont Co.), as well as a copolyparaphenylene-3,4'-oxydiphenylene terephthalamide containing impurity ions in small amounts (trademark: Technora, manufactured by Teijin Co.) and an aromatic polyester exhibiting liquid crystalline property upon melting having a small equilibrium moisture content and comprising a copolymer of a p-hydroxybenzoic acid and a 2,6-hydroxynaphthoic acid (trademark: Vectran, manufactured by Kuraray Co.). When a particularly high heat resistance is required, it is desired to use a polyparaphenylene benzobisoxazole (trademark: Xylon, manufactured by Toyo Boseki Co.).

In the heat-resistant synthetic fiber sheet of the present invention, when the fibrids only are used as a binder, the content of the heat-resistant organic synthetic polymer fibrids is in a range of from 3 to 60% by mass, preferably, from 4 to 45% by mass and, more preferably, from 5 to 30% by mass on the basis of the total mass of the sheet. When the content of the fibrids in the heat-resistant synthetic fiber sheet of the invention is smaller than 3% by mass, a tensile force (tensile strength) necessary for forming the sheet is not imparted to the sheet in the step of wet sheet making. When the content thereof exceeds 60% by mass, on the other hand, the bulk density of the obtained heat-resistant synthetic fiber sheet becomes too great (exceeds the upper limit in below-described preferred range of bulk density, i.e., exceeds 1.13 g/cm$^3$), and the sheet is not impregnated with the blended varnish to a sufficient degree.

When the content of the fibrids is set to be relatively low within the above range, it is desired to use the fibrids produced by a method (precipitating medium is added, shearing method) disclosed in, for example, Japanese Examined Patent Publication (Kokoku) No. 35-11851 or Japanese Examined Patent Publication (Kokoku) No. 37-5732. When the mixing ratio is set to be relatively high, on the other hand, it is desired to use the fibrids produced by a method (beating the molecule-oriented shaped articles) disclosed in Japanese Examined Patent Publication (Kokoku) No. 59-603. It is allowable to use the above fibrids produced by the above methods being mixed together as a matter of course.

When the fibrids produced by the former method (precipitating medium is added, shearing method) are used, there can be produced a heat-resistant synthetic fiber sheet having a high bulk density. When the fibrids produced by the latter method (beating the molecule-oriented shaped articles) of the latter method are used, on the other hand, there can be produced a heat-resistant synthetic fiber sheet having a low bulk density. Therefore, which one of the fibrids is used or how the mixing ratio of the two is selected, is determined depending upon the use of the obtained heat-resistant synthetic fiber sheet, such as properties required for the laminated material for electrical circuit boards.

Among the heat-resistant organic synthetic polymer staple fibers, further, some fibers tend to stretch or shrink in the axial direction of the fiber through the dehydration (dehumidifying) treatment for removing water content (moisture) contained in the fibers. Among the heat-resistant organic synthetic polymer fibrids, similarly, some thin leaf-like or scale-like fibrids tend to shrink or stretch in the direction of length through the same treatment as the one described above. By using the fibrids that stretch upon dehydration and the fibrids that shrink upon dehydration in combination, and at a suitable mixing ratio, depending upon the properties, therefore, it is allowed to obtain a heat-resistant synthetic fiber sheet of which the size does not change, or only changes a little, and which exhibits excellent heat-resistant dimensional stability and humidity-resistant dimensional stability even after the washing with water and drying are effected repetitively.

In the step of forming the sheet or in the step of wet sheet making, the heat-resistant organic synthetic polymer fibrids work as a binder for bonding staple fibers to each other. However, the bonding force (adhering force) thereof is smaller than that of thermosetting resins such as epoxy resin, phenol resin, polyurethane resin, melamine resin, formaldehyde resin or fluoropolymer resin. In the step of forming the sheet (step of wet sheet making), therefore, the sheet-forming performance is enhanced by using an organic resin binder selected from the above thermosetting resins instead of using the fibrids or together with the fibrids. In this case, the resin binder is used to substitute for the fibrids. When the fibrids and the resin binder are used in combination, therefore, the amount of the fibrids can be decreased by an amount of the resin binder that is added. In particular, when an epoxy resin having an epoxy functional group in the molecules thereof and is capable of being dispersed in water, is used as a resin binder, the obtained synthetic fiber sheet exhibits good compatibility to the blended varnish that is used in the step of preparing a prepreg, and there is obtained a product having good quality.

When the resin binder is used together with the fibrids, it is desired that the ratio of blending the resin binder to the total mass of the heat-resistant synthetic fiber sheet of the invention is 25% by mass or less and, more desirably, 20% by mass or less. When the blending ratio of the resin binder exceeds 25% by mass relative to the total mass of the heat-resistant synthetic fiber sheet containing the resin binder, the phenomenon of resin binder migration is not often suppressed to a sufficient degree in the step of forming the sheet (step of wet sheet making). Due to the migration of the resin binder, therefore, the interlayer adhering force becomes nonuniform among the front and back surfaces of the sheet and the intermediate layer thereof. Here, if the obtained sheet is calendered, the staple fibers distributed in the intermediate layer of the sheet are nonuniformly oriented, whereby the fiber density is distributed less uniformly making, after all, it difficult to obtain the synthetic fiber sheet having satisfactory quality.

In producing the heat-resistant synthetic fiber sheet of the present invention, further, the staple fibers disperse very favorably in the step of forming the sheet (step of wet sheet making). Therefore, the resin binder quickly permeates into the staple fiber webs even when the resin binder is used in a single kind. Besides, the phenomenon of resin binder migration is suppressed in the step of forming the sheet (step of wet sheet making) unless the content of the resin binder does not exceed a predetermined ratio. When the resin binder only is used as the binder, it is desired that the ratio of the resin binder relative to the total mass of the heat-resistant synthetic fiber sheet of the invention is from 3 to 60% by mass, preferably, from 3 to 20% by mass and, more preferably, from 4 to 15% by mass. When the mixing ratio of the resin binder is smaller than 3% by weight, a tensile force (tensile strength) necessary for forming the sheet is not often imparted to the sheet in the step of forming the sheet (step of wet sheet making) like when the fibrids are used in combination. When the mixing ratio exceeds 60% by mass, further, the phenomenon of resin binder migration is not suppressed in the step of forming the sheet (step of wet sheet making) like when the fibrids are used in combination.

The heat-resistant synthetic fiber sheet of the present invention can be produced by utilizing a known paper-making method. That is, a predetermined amount of the heat-resistant synthetic polymer staple fibers such as aromatic polyamide staple fibers and, as required, a predetermined amount of fibrids, are weighed, thrown into water and are homogeneously dispersed therein to prepare an aqueous slurry thereof having a staple fiber concentration or a total concentration of staple fibers and fibrids in a range of from about 0.15 to about 0.40% by mass. Then, as required, a dispersant and/or a viscosity-adjusting agent are added to the slurry and, then, a wet paper is formed by a wet sheet-making method using a Fortlinear paper machine or a cylinder machine. As required, further, an organic resin binder resin is applied onto the wet paper by a spray method or the like method in an amount of a predetermined solid component ratio, followed by drying. The obtained dry sheet is, as required, put to the heat press-shaping so as to obtain a predetermined bulk density, thereby to obtain a heat-resistant synthetic fiber sheet.

When, for example, the synthetic fiber sheet is to be put to the heat press-shaping treatment by using a calender machine, the calender treatment may be executed between a hard-surface roll having a diameter of about 15 to about 80 cm and an elastic roll of which the surface can be deformed having a diameter of about 30 to about 100 cm or, more preferably, between two hard-surface rolls having a diameter of about 20 to 80 cm. Here, in order that the heat-resistant organic synthetic polymer fibrids are softened or partly melted to fully exhibit the function as the binder component, it is desired that the calender treatment temperature is set in a temperature range of from 220 to 400° C., more preferably, from 250 to 350° C., and further preferably, from 280 to 330° C. A good result of bonding the staple fibers is obtained through the calender treatment within the above-mentioned temperature range. It is further desired that the calender treatment pressure is controlled to possess a line pressure in a range of from 1470 to 2450 N/cm (150 to 250 kg/cm) and, more preferably, from 1764 to 2450 N/cm (180 to 250 kg/cm). The heat press-treatment using the calender may be a one-step treatment by using a calender machine. To obtain a sheet which is more homogeneous in the direction of thickness, however, the heat press-treatment may be a two-step calender treatment including a preliminary heat press-treatment.

Through the above heat press-shaping treatment, it is desired that the heat-resistant synthetic fiber sheet is adjusted to possess a bulk density of from 0.45 to 1.13 g/cm$^3$, preferably, from 0.50 to 0.88 g/cm$^3$ and, more preferably, from 0.55 to 0.75 g/cm$^3$.

The step of producing the laminated material for electrical circuit boards from the heat-resistant synthetic fiber sheet of the present invention includes a step of heat treatment, usually, at a temperature of as high as about 220° C. Unless the thermal hysteresis at a temperature higher than the above heat treatment temperature is imparted in advance to the heat-resistant synthetic fiber sheet of the invention, therefore, the heat-resistant synthetic fiber sheet develops dimensional changes due to heat and/or internal strain. Therefore, the obtained product exhibits insufficient heat-resistant dimensional stability and insufficient resistance against deformation. It is, therefore, desired that the heat-resistant synthetic fiber sheet of the present invention is calendered under the conditions of a temperature of 280 to 330° C. and a line pressure of 1764 to 2450 N/cm (180 to 250 kg/cm). When heat-treated at a temperature of, for example, 280° C. for 5 minutes, the heat-resistant synthetic fiber sheet that is calendered under the above-mentioned conditions exhibits a dimensional change, due to heat, as small as 0.30% or less, proving excellent heat-resistant dimensional stability and, further, has a bulk density in a range of from 0.55 to 0.75 g/cm$^3$ exhibiting a tensile strength and an interlayer peeling strength which are large enough for practical use. Therefore, the heat-resistant synthetic fiber sheet of the invention which is calender-treated satisfies various properties required by the laminated material for electrical circuit boards and by the step of producing the laminated material. When the heat-pressing conditions in the calender treatment exceeds 400° C., 2450 N/cm (250 kg/cm), the bulk density of the obtained sheet may exceed 1.13 g/cm$^3$. Through the heat press-shaping treatment under the above-mentioned conditions, further, the coefficient of water absorption of the heat-resistant synthetic fiber sheet drops due to the crystallization of staple fibers constituting the sheet, making it possible to control the equilibrium moisture content of the sheet to be 3.5% or smaller.

It is desired that the heat-resistant synthetic polymer staple fibers and fibrids have equilibrium water contents of 7.5% or smaller. When the equilibrium water content is too high (when 7.5% is exceeded), the equilibrium moisture content of the obtained heat-resistant synthetic fiber sheet may often exceed 3.5% even if the obtained sheet is put to the heat press-shaping. The equilibrium moisture content of the sheet that exceeds 3.5% adversely affects the electrical characteristics such as insulation characteristics, and is not desirable. The heat-resistant synthetic fiber sheet used as a base material for the laminated material for electrical circuit boards requires careful attention for selecting the heat-resistant staple fibers contained therein and the heat-resistant fibrids, and for setting the blending ratio thereof.

The equilibrium moisture content of the heat-resistant synthetic fiber sheet of the present invention is measured by a method described below in compliance with JIS L 1013. That is, a sample heat-resistant synthetic fiber sheet is dried in an atmosphere at a temperature of 120° C. until the absolute water content becomes 0. The sample heat-resistant synthetic fiber sheet is measured for its mass in this absolutely dry state. Next, the sheet is left to stand in an atmosphere of a relative humidity of 65% RH for 72 hours to place the moisture-absorbing amount in an equilibrium state. Then, the moisture-absorbed heat-resistant synthetic fiber sheet is measured for its mass, the ratio (%) of the weight thereof to the above absolutely dry mass is calculated and is regarded to be an equilibrium moisture content of the sample sheet.

The heat-resistant synthetic fiber sheet of the invention contains heat-resistant organic synthetic polymer staple fibers and in which at least some staple fibers have flat end faces at both ends that are inclined at an angle of 10 degrees or more, preferably, 15 degrees or more and, further preferably, 20 degrees or more relative to a plane crossing the fiber axis of the fibers at right angles. In the step of forming the sheet (step of sheet making), therefore, the staple fibers are easily disaggregated, homogeneously dispersed, and are, then, homogeneously and firmly bonded together via fibrids and/or a resin binder having binding property. Therefore, despite of its relatively low bulk density, the heat-resistant synthetic fiber sheet of the invention possesses a large tensile strength and a large interlayer peeling strength while exhibiting a small dimensional change, in the sheet, in the direction of thickness and in the transverse direction, that is caused by changes in the temperature and humidity. Further, the heat-resistant synthetic fiber sheet of the invention is favorably impregnated with the blended varnish, permits the staple fibers to locally move little in the step of press-laminate formation and, hence, makes it possible to form a uniform laminated material.

EXAMPLES

The invention will now be concretely described by way of Examples to which, however, the invention is in no way limited.

Test pieces used in Examples were prepared by the methods described below and were evaluated by the evaluation methods described below.

(1) Preparation of Test Pieces.

(a) Production of para-aromatic polyamide fibers having flat end faces at both ends at an angle of 10 degrees or more to a plane crossing the fiber axis at right angles.

A plurality of para-aromatic polyamide multi-filament yarns having a fineness of 0.33 to 5.56 dtex (0.3 to 5.0 de) were combed while imparting water thereto, and were bundled together such that the total fineness was about 111,000 dtex (100,000 de). By using a guillotine cutter using a blade having a Rockwell hardness of HrA 91, the obtained multi-filament tows were cut into a predetermined length (2 to 12 mm) in a manner that the angle of the blade was 32 degrees to a plane crossing at right angles the longitudinal direction of the multi-filament toes to prepare aromatic polyamide staple fibers having cut faces inclined at an angle of 32 degrees to the plane crossing the fiber axis at right angles.

Here, annular projections had been formed at both flat end faces of the staple fibers, and a ratio $d_1/d_2$ of the largest cross-sectional size $d_1$ thereof and the average cross-sectional size $d_2$ of small-diameter portions between the projections on both sides, was 1.12.

For comparison, further, a plurality of aromatic polyamide multi-filament yarns having a fineness of 0.33 to 5.56 dtex were combed while imparting water thereto, and were bundled together such that the total fineness was about 111,000 dtex (100,000 de). By using a rotary cutter using a blade having a Rockwell hardness of HrA 91 and rotating at a blade tip linear velocity of 5 m/min, the obtained multi-filament tows were cut into a length of 2 to 12 mm to prepare aromatic polyamide staple fibers having cut faces inclined at an angle of 5 degrees to the plane crossing the fiber axis at right angles.

Here, annular projections had been formed at both flat end faces of the obtained staple fibers, and a ratio $d_1/d_2$ of the largest cross-sectional size $d_1$ thereof and the average cross-sectional size $d_2$ of small-diameter portions between the projections on both sides, was 1.03.

For comparison, further, a plurality of aromatic polyamide multi-filament yarns having a fineness of 0.33 to 5.56 dtex were combed while imparting water thereto, and were bundled together such that the total fineness was about 111,000 dtex (100,000 de). By using a guillotine cutter, the obtained multi-filament tows were cut into a length of 2 to 12 mm without inclining the blade to prepare aromatic polyamide staple fibers having cut faces inclined at an angle of 3 degrees to the plane crossing the fiber axis at right angles.

Here, annular projections had been formed at both flat end faces of the staple fibers, and a ratio $d_1/d_2$ of the largest cross-sectional size $d_1$ thereof and the average cross-sectional size $d_2$ of small-diameter portions between the projections on both sides, was 1.15.

(b) Production of Aromatic Polyamide Fiber Sheets.

The aromatic polyamide staple fibers described in (a) above, aromatic polyamide staple fibers described in Examples appearing below and organic synthetic polymer fibrids, were dispersed in water to prepare synthetic fiber sheets from the aqueous slurries by a wet sheet-making method. The synthetic fiber sheets were dried at 110° C., and the dried sheets were calendered using a calender apparatus having a pair of metal rolls under the conditions of a temperature of 200 to 350° C., a line pressure of 1960N/cm (200 kg/cm) and a calender speed of 4 m/min, to prepare heat-resistant synthetic fiber sheets.

(c) Production of Prepregs.

Heat-resistant synthetic fiber sheets described in (b) above were used as base materials and were impregnated with a resin varnish. The resin varnish was prepared by mixing a bisphenol A epoxy resin and a novolak epoxy resin at a mass ratio of 10:90 to 50:50, adding, to the mixed resins thereof, a curing agent in such an amount that the ratio of the equivalent of the phenolic hydroxy groups of the curing agent to the epoxy equivalent of the mixed resins was 0.6 to 1.3, adding thereto a cure-promoting agent in such an amount that the ratio of the mass of solid component of the cure-promoting agent was 0.001 to 1% by mass to the whole mass of solid components of the mixed resins, and by further adding thereto a solvent such that the concentration of the mixed resins, curing agent and cure-promoting agent in the solvent solution was 40 to 70% by mass. As for the method of impregnation, the base material was fed to an application machine so as to be continuously impregnated with the resin varnish. The solvent was then removed from the impregnated sheets to thereby prepare prepregs.

(d) Production of Printed Wiring Boards.

An electrolytic copper foil with a thickness of 35 μm was placed on both surfaces of the prepregs described in (c) above, and was heat press-adhered thereon under the conditions of a pressure of 20 to 50 kg/cm² and a laminating temperature of 0 to 260° C. for 60 minutes. The laminating temperature was suitably set depending upon the kind of the impregnating resin that was used and the curing temperature.

(2) Angles subtended by the two flat end faces of the staple fiber and a plane crossing the fiber axis at right angles.

A hundred sample staple fibers were observed through an optical microscope, and angles α subtended by the plane crossing the fiber axis 2 at right angles and the flat end faces 1a, b or 4a, 4b of staple fibers were measured as shown in FIG. 1 or 2 to find an average value thereof.

(3) Bulk Density of the Sheet.

Measured by a method in compliance with JIS C-2111-6.1.

(4) Tensile Strength of the Sheet.

Measured by a method in compliance with JIS C-2111-7 by using a constant-speed elongation tensile tester.

(5) Heat Dimensional Change of the Sheet.

Five pieces of sheets measuring 250 mm long and 50 mm wide were obtained in the longitudinal direction and in the transverse direction. By using a high-precision two-dimensional coordinate measuring machine (manufactured by Muto Kogyo Co.), the sheets were measured for their lengths in the longitudinal direction before the heat treatment and after the heat treatment at a temperature of 280° C. for 5 minutes, to calculate the heat dimensional change in accordance with the following formula. The average values of the samples picked up in the longitudinal direction and in the transverse direction were found.

Heat dimensional change (%)={(|length before heat treatment−length after heat treatment|)/length before heat treatment}×100

(6) Crack Resistance of the Printed Wiring Boards.

The copper foil of the uppermost layer of the laminated material for printed boards described in (1)(d) above was etched. Then, a resist was applied thereon to prepare test pieces of laminated materials for printed wiring boards on which the circuit has been formed. The test pieces were heated and cooled over a temperature range of from −55 to +125° C. 400 times. The test pieces were cut, and the cut surfaces were observed on an enlarged scale near the boundary between the wiring copper foil and the resist by using a digital high-scope system (KH-2400DP, manufactured by HIROX) and a color video printer (US-2300, manufactured by Sony Co.), and the occurrence of cracks was evaluated in three steps as described below.

3: No cracking occurred (15 places of the test pieces selected at random were observed, and the occurrence of crack was not at all observed).

2: Cracking occurred slightly (15 places of the test pieces selected at random were observed, and the occurrence a of faint crack was observed at one place).

1: Cracking occurred (15 places of the test pieces selected at random were observed, and cracks occurred at two or more places).

(7) Deformation of the Laminated Materials.

To a mixed resin of a bromated bisphenol A epoxy resin of a high purity and an orthocresol novolak epoxy resin at a mass ratio of 25/75, there was added, as a curing agent, a dicyan diamide in such an amount that the phenolic hydroxyl group equivalent of the curing agent was 0.8 relative to the epoxy equivalent of the mixed resin. There was further added, as a cure-promoting agent, a 2-ethyl-4-methylimidazole in such an amount that the ratio of the mass of solid component of the cure-promoting agent was 0.03% by mass relative to the whole mass of solid components of the mixed resin, thereby to prepare an epoxy resin composition. The composition was dissolved in a mixed solvent of a methyl ethyl ketone and a methyl cellosolve, so that the concentration of the epoxy resin composition was 60% by mass to thereby prepare a varnish to be blended. The above aromatic polyamide fiber sheet was impregnated with the varnish to be blended, and was dried at a temperature of 110 to 120° C. for 5 to 10 minutes to prepare a prepreg sheet of the B-stage. The volume content of the resin in the prepreg sheet was 55%.

The prepreg sheet was laminated on both surfaces of the copper foil of a thickness of 18 μm. On both outer sides thereof, there were further laminated the same copper foil. The laminated material was hot-pressed under the conditions of a reduced pressure at 170° C.×40 kg/cm×50 minutes to cure the impregnated resin thereby to prepare a laminated material for electrical circuit boards. The laminated material was further cured in a hot air dryer at a temperature of 200° C. for about 20 minutes.

The obtained laminated material for electrical circuit boards was cut into a square of a side of 150 mm, the copper foils on both surfaces of the laminated material were partly etched to remove portions corresponding to a square of a side of 110 mm on the inside leaving frame-like portions of a width of 20 mm from the ends of the copper foils to prepare a test sample for evaluation.

The laminated material for electrical circuits that was thus partly etched was heat-treated at 260° C. for 10 minutes, and a maximum amount of deformation that occurred, starting from the central portion thereof, was measured and was regarded to be the amount of deformation of the sample laminated material.

(8) Insulation resistance (BDV) under highly humid conditions.

Comb-shaped electrodes maintaining a gap of 0.15 mm were formed by etching on one surface of the laminated material for electrical circuit boards described in (7) above, and were left to stand for 1000 hours while applying a DC voltage of 35 V across the comb-shaped electrodes in an atmosphere of a temperature of 60° C. and a relative humidity of 95% RH. Next, the comb-shaped electrodes were left to stand for one hour in an atmosphere of a temperature of 20° C. and a relative humidity of 60% RH and, then, a DC voltage (35 to 90 V) was applied across the comb-shaped electrodes for 60 seconds to measure the insulation resistance (Ω-cm).

Example 1

95% by weight of heat-resistant organic synthetic polymer staple fibers of a copolyparaphenylene-3,4'-oxydiphenylene terephthalamide having a single fiber fineness of 1.67 dtex (1.5 de), a fiber length of 3 mm and an equilibrium moisture content of 1.8% (trademark: Technora, manufactured by Teijin Co.) and 5% by weight of heat-resistant organic synthetic polymer fibrids of a polymetaphenylene isophthalamide (trademark: Nomex, manufactured by du Pont Co.) were dispersed in water by using a pulper and to which was added a dispersant (trademark: YM-80, manufactured by Matsumoto Yushi Co.) in such an amount that the concentration thereof was 0.03% to thereby prepare staple fibers for sheet making/fibrids slurry having a fiber concentration of 0.20% by weight.

Here, the staple fibers of the copolyparaphenylene-3,4'-oxydiphenylene terephthalamide were those that had been so cut by the method described in (1)(a) above that the angle subtended by the cut surfaces thereof and a plane crossing the fiber axis at right angles was 32 degrees, and a ratio of the largest cross-sectional size $d_1$ of the annular projections formed at both flat end faces and the average cross-sectional size $d_2$ of a narrow potion between the projections was 1.12.

Next, by using the Tappy-type square manual paper-making machine, the slurry for sheet making was formed into a paper-like sheet, lightly pressurized and dehydrated, and was dried in a hot air dryer heated at a temperature of 160° C. for about 15 minutes to prepare an aromatic polyamide fiber sheet.

Next, the sheet was passed through a calender machine comprising a pair of hard surface metallic rolls of a diameter of about 400 mm and was heat-pressed under the conditions of a temperature of 230° C. and a line pressure of 160 kg/cm, and was, further, passed through a high-temperature high calender machine comprising a pair of hard surface metallic rolls of a diameter of about 500 mm and was heat-pressed under the conditions of a temperature of 320° C. and a line pressure of 200 kg/cm, in order to soften and partly melt the polymetaphenylene isophthalamide fibrids and to firmly adhere them to the copolyparaphenylene-3,4'-oxydiphenylene terephthalamide staple fibers. There was obtained a heat-resistant aromatic polyamide fiber sheet having a basis weight of 72 g/m². The heat-resistant fiber sheet possessed an equilibrium moisture content of 1.9%.

Table 1 shows the components constituting the aromatic polyamide fiber sheet that was obtained, and Table 2 shows the angles subtended by the flat end faces of the fibers and the plane crossing the fiber axis at right angles, and a ratio $d_1/d_2$. Table 3 shows the evaluated results of various properties of the laminated material for electrical circuit boards produced by preparing a prepreg sheet by impregnating the aromatic polyamide fiber sheet with the varnish to be blended by the method described in (1)(c) above and by using the thus prepared prepreg sheet based on the method described in (1)(d) above.

Examples 2 to 4 and Comparative Examples 1 and 2.

In Examples 2 to 4 and in Comparative Examples 1 and 2, the heat-resistant synthetic fiber sheets were prepared in the same manner as in Example 1, and prepreg sheets were prepared to prepare laminated materials for electrical circuit boards and to measure various properties. Here, however, the mixing ratios of the copolyparaphenylene-3,4'-oxydiphenylene terephthalamide staple fibers and the polymetaphenylene isophthalamide fibrids used in Example 1 were varied as shown in Table 1. The constitutions of the obtained aromatic polyamide fiber sheets, the ratios $d_1/d_2$ and properties of the laminated materials were as shown in Tables 1, 2 and 3.

Example 5

An experiment in the same manner as in Example 2 was carried out. Here, however, there was used 90% by weight of polyparaphenylene terephthalamide staple fibers (single fiber fineness of 1.58 dtex (1.42 de), fiber length of 3 mm; trademark: Kevlar, manufactured by Du Pont Co.) instead of using the staple fibers (trademark: Technora) used in Example 2. The angle of inclination of the flat end faces of the staple fibers was 35 degrees, and the ratio $d_1/d_2$ of the largest cross-sectional size $d_1$ of the annular projections formed at both flat end faces and the average cross-sectional size $d_2$ of the intermediate portion was 1.17. The constitution of the obtained aromatic polyamide fiber sheet, the ratio $d_1/d_2$ and properties of the laminated material were as shown in Tables 1, 2 and 3.

Example 6

An experiment was conducted in the same manner as in Example 2. Here, however, there were used 75% by weight of copolyparaphenylene-3,4'-oxydiphenylene terephthalamide staple fibers (single fiber fineness of 1.67 dtex (1.5 de), fiber length of 3 mm, equilibrium moisture content of 1.8%; trademark: Technora, manufactured by Teijin Co.) and 15% by weight of polymetaphenylene isophthalamide staple fibers (stretched in the step of production at a ratio of 1.4 times, single fiber fineness of 3.33 dtex (3.0 de), fiber length of 6 mm, trademark: Conex, manufactured by Teijin Co.) instead of using the Technora (trademark) staple fibers used in Example 2. The constitution of the obtained aromatic polyamide fiber sheet, the ratio $d_1/d_2$ and properties of the laminated material were as shown in Tables 1, 2 and 3.

Example 7

An experiment was conducted in the same manner as in Example 2. Here, however, there were used 7% by weight of the heat-resistant organic synthetic polymer fibrids of polymetaphenylene isophthalamide (trademark: Nomex, manufactured by du Pont Co.). After the sheet making, further, a bisphenol A epichlorohydrin-type water-dispersing epoxy resin binder (water-diluted solution of Dainihon Kagaku Kogyo Co., solid component concentration of 5% by weight) was sprayed onto the obtained wet sheet such that the amount of adhesion of the solid component of the resin was 3% by weight. The constitution of the obtained aromatic polyamide fiber sheet, the ratio $d_1/d_2$ and properties of the laminated material were as shown in Tables 1, 2 and 3.

Example 8

An experiment was conducted in the same manner as in Example 3. Here, however, there were used 20% by weight of the heat-resistant organic synthetic polymer fibrids of polyparaphenylene terephthalamide (trademark: Twaron Pulp, manufactured by Teijin Twaron Co.). After the sheet making, further, a bisphenol A epichlorohydrin-type water-dispersing epoxy resin binder (water-diluted solution of Dainihon Kagaku Kogyo Co., solid component concentration of 5% by weight) was sprayed onto the obtained wet sheet such that the amount of adhesion of the solid component of the resin was 5% by weight. The constitution of the obtained aromatic polyamide fiber sheet, the ratio $d_1/d_2$ and properties of the laminated material were as shown in Tables 1, 2 and 3.

Example 9

An experiment was conducted in the same manner as in Example 2. Here, however, there were used staple fibers of polyparaphenylenebenzobis oxazole (trademark: Zylon, manufactured by Toyoboseki Co.) instead of using the staple fibers of polymetaphenylene isophthalamide used in Example 6. The angle of inclination of the flat end faces of the staple fibers was 40 degrees, and the ratio $d_1/d_2$ of the largest cross-sectional size $d_1$ of the annular projections

19 formed at both flat end faces and the average cross-sectional size $d_2$ of the intermediate portion between the two projections was 1.22. The constitution of the obtained aromatic polyamide fiber sheet, the ratio $d_1/d_2$ and properties of the laminated material were as shown in Tables 1, 2 and 3.

Example 10

An experiment was conducted in the same manner as in Example 6. Here, however, there were used staple fibers of an aromatic polyester that exhibited liquid crystalline property upon melting (trademark: Vectran, manufactured by Kuraray Co.), which was a copolymer of a p-hydroxybenzoic acid and a 2,6-hydroxynaphthoic acid, instead of using the polymetaphenylene isophthalamide staple fibers used in Example 6. The angle of inclination of the flat end faces of the staple fibers was 24 degrees, and the ratio $d_1/d_2$ of the largest cross-sectional size $d_1$ of the annular projections formed at both flat end faces and the average cross-sectional size $d_2$ of the intermediate portion between the two projections was 1.14. The constitution of the obtained aromatic polyamide fiber sheet, the ratio $d_1/d_2$ and properties of the laminated material were as shown in Tables 1, 2 and 3.

Example 11

Experiment 11 was conducted in the same manner as in Example 6. Here, however, there were used staple fibers of a polyetheretherketone (manufactured by Teijin Co.) instead of using the polymetaphenylene isophthalamide staple fibers used in Example 6. The angle of inclination of the flat end faces of the staple fibers was 28 degrees, and the ratio $d_1/d_2$ of the largest cross-sectional size $d_1$ of the annular projections formed at both flat end faces and the average cross-sectional size $d_2$ of the intermediate portion between the two projections was 1.19. The constitution of the obtained aromatic polyamide fiber sheet, the ratio $d_1/d_2$ and properties of the laminated material were as shown in Tables 1, 2 and 3.

Example 12

Experiment 12 was conducted in the same manner as in Example 2. Here, however, there were used fibrids of a copolyparaphenylene-3,4'-oxydiphenylene terephthalamide instead of using the polymetaphenylene isophthalamide fibrids used in Example 2. The constitution of the obtained aromatic polyamide fiber sheet, the ratio $d_1/d_2$ and properties of the laminated material were as shown in Tables 1, 2 and 3.

Example 13

Experiment 13 was conducted in the same manner as in Example 2. Here, however, there were used fibrids of an aromatic polyester that exhibited liquid crystalline property upon melting obtained by copolymerizing a p-hydroxybenzoic acid and a 2,6-hydroxynaphthoic acid instead of using the polymetaphenylene isophthalamide fibrids used in Example 2. The constitution of the obtained aromatic polyamide fiber sheet, the ratio $d_1/d_2$ and properties of the laminated material were as shown in Tables 1, 2 and 3.

Example 14

Experiment 14 was conducted in the same manner as in Example 2. Here, however, there were used fibrids of a polyparaphenylenebenzobis oxazole instead of using the polymetaphenylene isophthalamide fibrids used in Example 2. The constitution of the obtained aromatic polyamide fiber sheet, the ratio $d_1/d_2$ and properties of the laminated material were as shown in Tables 1, 2 and 3.

Comparative Example 3

75% by weight of heat-resistant organic synthetic polymer staple fibers of a copolyparaphenylene-3,4'-oxydiphenylene terephthalamide having a single fiber fineness of 1.67 dtex (1.5 de), a fiber length of 3 mm and an equilibrium moisture content of 1.8% (trademark: Technora, manufactured by Teijin Co.) and 15% by weight of polymetaphenylene isophthalamide staple fibers stretched at a ratio of 1.4 times in the step of production and having a single fiber fineness of 3.33 dtex (3.0 de) and a fiber length of 6 mm (trademark: Conex, manufactured by Teijin Co.), as well as 10% by weight of heat-resistant organic synthetic polymer fibrids of a polymetaphenylene isophthalamide (trademark: Nomex, manufactured by du Pont Co.) were dispersed in water by using a pulper and to which was added a dispersant (trademark: YM-80, manufactured by Matsumoto Yushi Co.) in such an amount that the concentration thereof was 0.03% to thereby prepare a slurry for sheet making having a fiber concentration of 0.20% by weight.

Here, the staple fibers of the copolyparaphenylene-3,4'-oxydiphenylene terephthalamide and the staple fibers of the polymetaphenylene isophthalamide were those that had been so cut that the angles of inclination at the end flat faces thereof formed by the method described in (1)(a) above were both 5 degrees and that ratios of the largest cross-sectional size $d_1$ of the annular projections formed at both flat end faces and the average cross-sectional size $d_2$ of an intermediate potion between the two projections were 1.03 and 1.12, respectively.

Table 1 shows the components constituting the aromatic polyamide fiber sheet that was obtained, and Table 2 shows the angles subtended by the flat end faces of the fibers and the plane crossing the fiber axis at right angles, and a ratio $d_1/d_2$. Table 3 shows the evaluated results of various properties of the laminated material for electrical circuit boards produced by preparing a prepreg sheet by impregnating the aromatic polyamide fiber sheet with the varnish to be blended by the method described above and by using the thus prepared prepreg sheet.

Comparative Example 4

An experiment was conducted in the same manner as in Comparative Example 3. Here, however, there were used staple fibers of polyparaphenylenebenzobis oxazole instead of using the staple fibers of polymetaphenylene isophthalamide used in Comparative Example 3. The angle of inclination of the flat end faces of the staple fibers was 4 degrees, and the ratio $d_1/d_2$ of the largest cross-sectional size $d_1$ of the annular projections formed at both flat end faces and the average cross-sectional size $d_2$ of the intermediate portion between the two projections was 1.19. The constitution of the obtained aromatic polyamide fiber sheet, the ratio $d_1/d_2$ and properties of the laminated material were as shown in Tables 1, 2 and 3.

Comparative Example 5

An experiment was conducted in the same manner as in Comparative Example 3. Here, however, there were used staple fibers of an aromatic polyester that exhibited liquid crystalline property upon melting, which was a copolymer of a p-hydroxybenzoic acid and a 2,6-hydroxynaphthoic acid, instead of using the polymetaphenylene isophthalamide staple fibers used in Comparative Example 3. The angle of inclination of the flat end faces of the staple fibers was 8 degrees, and the ratio $d_1/d_2$ of the largest cross-sectional size $d_1$ of the annular projections formed at both flat end faces and the average cross-sectional size $d_2$ of the intermediate portion between the two projections was 1.14.

Comparative Example 6

An experiment was conducted in the same manner as in Comparative Example 3. Here, however, there were used staple fibers of a polyetheretherketone instead of using the polymetaphenylene isophthalamide staple fibers used in Comparative Example 3. The angle of inclination of the flat end faces of the staple fibers was 7 degrees, and the ratio $d_1/d_2$ of the largest cross-sectional size $d_1$ of the annular projections formed at both flat end faces and the average cross-sectional size $d_2$ of the intermediate portion between the two projections was 1.15.

Comparative Example 7

75% by weight of heat-resistant organic high molecular polymer staple fibers of a copolyparaphenylene-3,4'-oxydiphenylene terephthalamide having a single fiber fineness of 1.67 dtex (1.5 de), a fiber length of 3 mm and an equilibrium moisture content of 1.8% (trademark: Technora, manufactured by Teijin Co.), 15% by weight of polymetaphenylene isophthalamide staple fibers stretched at a ratio of 1.4 times in the step of production and having a single fiber fineness of 3.33 dtex (3.0 de) and a fiber length of 6 mm (trademark: Conex, manufactured by Teijin Co.), as well as 10% by weight of heat-resistant organic high molecular polymer fibrids of a polymetaphenylene isophthalamide (trademark: Nomex, manufactured by du Pont Co.) were dispersed in water by using a pulper and to which was added a dispersant (trademark: YM-80, manufactured by Matsumoto Yushi Co.) in such an amount that the concentration thereof was 0.03% to thereby prepare a slurry for sheet making having a fiber concentration of 0.20% by weight.

Here, the staple fibers of the copolyparaphenylene-3,4'-oxydiphenylene terephthalamide were those that had been so cut by the method described in (1)(a) above that the angle of inclination subtended by the cut faces and a plane crossing the fiber axis at right angles was 3 degrees and that the ratio of the largest cross-sectional size $d_1$ of the annular projections formed at both flat end faces and the average cross-sectional size $d_2$ of the intermediate potion between the two projections was 1.15.

Table 1 shows the components constituting the aromatic polyamide fiber sheet that was obtained, and Table 2 shows the angle subtended by the flat end faces of the fibers and the plane crossing the fiber axis at right angles, and a ratio $d_1/d_2$. Table 3 shows the evaluated results of various properties of the laminated material for electrical circuit boards produced by preparing a prepreg sheet by impregnating the aromatic polyamide fiber sheet with the varnish to be blended by the method described above and by using the thus prepared prepreg sheet.

TABLE 1

| Example | | Staple fibers comprising heat-resistant organic synthetic polymer | | | | Fibrids and resin binder | | | |
|---|---|---|---|---|---|---|---|---|---|
| | | Type of fibers | Content (%) | Type of fibers | Content (%) | Fibrids | Content (%) | Resin binder | Content (%) |
| Example | 1 | Technora | 95 | | | Nomex | 5 | | |
| | 2 | Technora | 90 | | | Nomex | 10 | | |
| | 3 | Technora | 75 | | | Nomex | 25 | | |
| | 4 | Technora | 65 | | | Nomex | 35 | | |
| Comparative Example | 1 | Technora | 98 | | | Nomex | 2 | | |
| | 2 | Technora | 35 | | | Nomex | 65 | | |
| Example | 5 | Kevlar | 90 | | | Nomex | 10 | | |
| | 6 | Technora | 75 | Conex | 15 | Nomex | 10 | | |
| | 7 | Technora | 90 | | | Nomex | 7 | Epoxy resin | 3 |
| | 8 | Technora | 75 | | | Twaron | 20 | Epoxy resin | 5 |
| | 9 | Technora | 75 | Zylon | 15 | Nomex | 10 | | |
| | 10 | Technora | 75 | Vectran | 15 | Nomex | 10 | | |
| | 11 | Technora | 75 | PEEK | 15 | Nomex | 10 | | |
| | 12 | Technora | 90 | | | Technora | 10 | | |
| | 13 | Technora | 90 | | | Vectran | 10 | | |
| | 14 | Technora | 90 | | | Zylon | 10 | | |
| Comparative Example | 3 | Technora | 75 | Conex | 15 | Nomex | 10 | | |
| | 4 | Technora | 75 | Zylon | 15 | Nomex | 10 | | |
| | 5 | Technora | 75 | Vectran | 15 | Nomex | 10 | | |
| | 6 | Technora | 75 | PEEK | 15 | Nomex | 10 | | |
| | 7 | Technora | 75 | Conex | 15 | Nomex | 10 | | |

TABLE 2

| Example | Type of fibers | Inclining angles of end faces (Degree) | $d_1/d_2$ | Type of fibers | Inclining angles of end faces (Degree) | $d_1/d_2$ |
|---|---|---|---|---|---|---|
| Example 1 | Technora | 32 | 1.12 | | | |
| 2 | Technora | 32 | 1.12 | | | |
| 3 | Technora | 32 | 1.12 | | | |
| 4 | Technora | 32 | 1.12 | | | |
| Comparative 1 | Technora | 32 | 1.12 | | | |
| Example 2 | Technora | 32 | 1.12 | | | |
| Example 5 | Kevlar | 35 | 1.17 | | | |
| 6 | Technora | 32 | 1.12 | Conex | 25 | 1.21 |
| 7 | Technora | 32 | 1.12 | | | |
| 8 | Technora | 32 | 1.12 | | | |
| 9 | Technora | 32 | 1.12 | Zylon | 40 | 1.22 |
| 10 | Technora | 32 | 1.12 | Vectran | 24 | 1.14 |
| 11 | Technora | 32 | 1.12 | PEEK | 28 | 1.19 |
| 12 | Technora | 32 | 1.12 | | | |
| 13 | Technora | 32 | 1.12 | | | |
| 14 | Technora | 32 | 1.12 | | | |
| Comparative 3 | Technora | 5 | 1.03 | Conex | 5 | 1.12 |
| Comparative 4 | Technora | 5 | 1.03 | Zylon | 4 | 1.19 |
| Example 5 | Technora | 5 | 1.03 | Vectran | 8 | 1.14 |
| 6 | Technora | 5 | 1.03 | PEEK | 7 | 1.15 |
| 7 | Technora | 3 | 1.15 | Conex | 5 | 1.12 |

[Note]
PEEK: Polyetheretherketone

TABLE 3

| Example | Bulk density (g/cm³) | Tensile strength (N/cm) | Heat dimensional change (%) | Crack resistance | Deformation (mm) | BDV (Ω/cm) |
|---|---|---|---|---|---|---|
| Example 1 | 0.52 | 53.90 | 0.12 | 3 | 2.3 | $10^{12}$ |
| 2 | 0.56 | 72.45 | 0.11 | 3 | 2.4 | $10^{11}$ |
| 3 | 0.64 | 89.84 | 0.10 | 2–3 | 2.7 | $10^{11}$ |
| 4 | 0.69 | 97.66 | 0.15 | 2–3 | 2.8 | $10^{11}$ |
| Comparative 1 | 0.39 | 14.15 | 0.37 | 1 | 2.3 | $10^{9}$ |
| Example 2 | 1.17 | 58.80 | 0.38 | 1 | 4.7 | $10^{8}$ |
| Example 5 | 0.67 | 63.70 | 0.09 | 3 | 1.9 | $10^{10}$ |
| 6 | 0.52 | 75.23 | 0.19 | 3 | 3.1 | $10^{11}$ |
| 7 | 0.57 | 81.32 | 0.23 | 2–3 | 3.4 | $10^{11}$ |
| 8 | 0.66 | 75.46 | 0.14 | 3 | 2.8 | $10^{12}$ |
| 9 | 0.67 | 55.97 | 0.06 | 2–3 | 1.7 | $10^{10}$ |
| 10 | 0.64 | 59.84 | 0.09 | 3 | 1.9 | $10^{10}$ |
| 11 | 0.69 | 52.98 | 0.11 | 3 | 1.8 | $10^{10}$ |
| 12 | 0.61 | 73.78 | 0.08 | 3 | 2.6 | $10^{12}$ |
| 13 | 0.58 | 49.51 | 0.08 | 3 | 1.7 | $10^{11}$ |
| 14 | 0.54 | 47.24 | 0.05 | 3 | 1.5 | $10^{12}$ |
| Comparative 3 | 0.66 | 32.66 | 0.38 | 1 | 5.3 | $10^{12}$ |
| Example 4 | 0.64 | 33.11 | 0.08 | 1 | 4.0 | $10^{10}$ |
| 5 | 0.60 | 34.48 | 0.12 | 1 | 5.1 | $10^{9}$ |
| 6 | 0.66 | 38.35 | 0.15 | 1 | 4.8 | $10^{9}$ |
| 7 | 0.61 | 75.46 | 0.14 | 1 | 1.3 | $10^{9}$ |

INDUSTRIAL APPLICABILITY

The laminated material for electrical circuit boards obtained by using the heat-resistant synthetic fiber sheet of the invention as a base material hardly produces twist, warping or undulation, and makes it possible to form fine circuity. Even when electronic parts having small coefficients of thermal and humidity expansion such as a leadless ceramic chip carrier (LCCC) and a bare chip are directly mounted thereon by soldering, a high degree of reliability can be maintained over extended periods of time. Therefore, the heat-resistant synthetic fiber sheet of the invention is very useful as a base material for the laminated material for electrical circuit boards used for the applications where there are required very small weight, high degree of heat resistance, humidity-resistant dimensional stability and electrical insulation.

What is claimed is:

1. A heat-resistant synthetic fiber sheet comprising, as principal components, a plurality of staple fibers comprising a heat-resistant organic synthetic polymeric material and a binding member selected from the group consisting of (1) heat resistant organic synthetic polymer fibrids and (2) mixtures of the heat resistant organic synthetic polymer fibrids with organic resin binders, wherein, the plurality of staple fibers are bound to each other through the binding member, to form a paper-like sheet, the content of the staple fibers is in the range of 40 to 97% by mass on the basis of the total mass of the sheet, and the total content of the binding member is in a range of from 3 to 60% by mass on the basis of the total mass of the sheet, and at least a portion of the staple fibers each have two flat end faces at an angle of 10 degrees or more to a plane crossing the fiber axis of the staple fiber at right angles.

2. The heat-resistant synthetic fiber sheet as claimed in claim 1, wherein at least a portion of the plurality of the heat-resistant organic synthetic polymer staple fibers each have at least two annular projections spaced from each other in the longitudinal direction of the staple fiber, and in each staple fiber, the largest cross-sectional size of the annular projection is 1.1 times or more the average cross-sectional size of a portion between the two annular projections of the staple fiber.

3. The heat-resistant synthetic fiber sheet claimed in claim 2, wherein in each of the plurality of heat-resistant organic synthetic polymer staple fibers, the two flat end faces at an angle of 10 degrees or more to the fiber axis are formed in the annular projections.

4. The heat-resistant synthetic fiber sheet as claimed in any one of claims 1 to 3, wherein the plurality of heat-resistant organic synthetic polymer staple fibers contain para-aromatic polyamide staple fibers in an amount of 40% by mass or more, on the basis of the total mass of the plurality of heat-resistant synthetic polymer staple fibers.

5. The heat-resistant synthetic fiber sheet as claimed in claim 4, wherein the para-aromatic polyamide staple fibers are selected from the group consisting of staple fibers comprising a polyparaphenylene terephthalamide and staple fibers comprising a copolyparaphenylene.3,4'-oxydiphenylene terephthalamide.

6. The heat-resistant synthetic fiber sheet as claimed in claim 1, wherein the heat-resistant organic synthetic polymer from which the staple fibers are formed is selected from wholly aromatic polyesters exhibiting a liquid crystalline property upon melting.

7. The heat-resistant synthetic fiber sheet as claimed in any one of claims 1 to 3, wherein the heat-resistant organic synthetic polymer from which the staple fibers are formed is selected from heterocyclic group-containing aromatic polymers.

8. The heat-resistant synthetic fiber sheet as claimed in any one of claims 1 to 3, wherein the heat-resistant organic synthetic polymer from which the staple fibers are formed is selected from polyetheretherketones.

9. The heat-resistant synthetic fiber sheet as claimed in claim 1 to 3, wherein the plurality of heat-resistant organic synthetic polymer staple fibers have a fiber length in the range of from 2 to 12 mm.

10. The heat-resistant synthetic fiber sheet as claimed in claim 1, wherein at least a portion of the fibrids comprising the organic synthetic polymer melt-bond the plurality of staple fibers to each other therethrough.

11. The heat-resistant synthetic fiber sheet as claimed in claims 1 or 2, wherein the heat-resistant organic synthetic polymer from which the fibrids are formed, has a thermal decomposition-initiating temperature of 330° C. or more.

12. The heat-resistant synthetic fiber sheet as claimed in claim 1, wherein the heat resistant organic synthetic polymer fibrids are ones prepared by mixing a solution of the organic synthetic polymer for the fibrids with a precipitating medium for the synthetic polymer solution, while applying a shearing force to the solution.

13. The heat-resistant synthetic fiber sheet as claimed in claim 1, wherein the heat-resistant organic synthetic polymer fibrids are ones prepared in a procedure such that shaped articles having a molecule-orientating property are formed from a solution of the organic synthetic polymer having an optical anisotropy, and applying a mechanical shearing force to the molecule-orientated shaped articles to fibrillate at random the molecule-orientated shaped articles.

14. The heat-resistant synthetic fiber sheet as claimed in claim 1, wherein the heat resistant organic synthetic polymer from which the fibrids are formed, is selected from the group consisting of polyparaphenylene terephthalamide and copolyparaphenylene.3,4'-oxydiphenylene terephthalamide.

15. The heat-resistant synthetic fiber sheet as claimed in claim 1, wherein the heat-resistant organic synthetic polymer from which the fibrids are formed, is selected from wholly aromatic polyesters exhibiting a liquid crystalline property upon melting.

16. The heat-resistant synthetic fiber sheet as claimed in claim 1, wherein the heat-resistant synthetic polymer from which the fibrids are formed, is selected from the heterocyclic group-containing aromatic polymers.

17. The heat-resistant synthetic fiber sheet as claimed in claim 1, wherein the organic resin binder comprises at least one member selected from the group consisting of epoxy resins, phenol resins, melamine resins, formaldehyde resins and fluoro polymer resins.

18. The heat-resistant synthetic fiber sheet as claimed in claim 1, having a bulk density of 0.40 to 1.13 glcm3.

19. The heat-resistant synthetic fiber sheet as claimed in claim 1, having an equilibrium moisture content of 3.5% or less.

20. The heat-resistant synthetic fiber sheet as claimed in claim 1, exhibiting a dimensional change of 0.30 or less in the longitudinal direction of the sheet when the sheet is heat treated at a temperature at 280° C. for 5 minutes.

21. A prepreg comprising a heat-resistant synthetic fiber sheet as claimed in claim 1 and a thermosetting resin with which the synthetic fiber sheet is impregmated.

22. A laminated board comprising a heat press-shaped article of a prepreg comprising a heat-resistant synthetic fiber sheet as claimed in claim 1 and a thermosetting resin with which the synthetic fiber sheet is impregnated.

* * * * *